United States Patent
Subramanian et al.

(10) Patent No.: US 6,423,479 B1
(45) Date of Patent: Jul. 23, 2002

(54) CLEANING CARBON CONTAMINATION ON MASK USING GASEOUS PHASE

(75) Inventors: Ramkumar Subramanian; Khoi A. Phan, both of San Jose; Bharath Rangarajan, Santa Clara; Bhanwar Singh, Morgan Hill; Sanjay K. Yedur, Santa Clara; Bryan K. Choo, Mountain View, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/495,165

(22) Filed: Jan. 31, 2000

(51) Int. Cl.[7] .............................. G03F 7/26; G03F 9/00
(52) U.S. Cl. ........................... 430/329; 430/322; 134/1
(58) Field of Search .................................. 430/322, 329; 134/1

(56) References Cited

U.S. PATENT DOCUMENTS

| | | | |
|---|---|---|---|
| 4,778,536 A | 10/1988 | Grebinski | 134/36 |
| 5,037,506 A | 8/1991 | Gupta et al. | 156/646 |
| 5,356,478 A | 10/1994 | Chen et al. | 134/1 |
| 5,753,137 A | 5/1998 | Ye et al. | 252/79.1 |
| 5,763,016 A | 6/1998 | Levenson et al. | 427/510 |
| 5,849,639 A | 12/1998 | Molloy et al. | 438/714 |

*Primary Examiner*—Kathleen Duda
(74) *Attorney, Agent, or Firm*—Amin & Turocy, LLP

(57) ABSTRACT

In one embodiment, the present invention relates to a method of processing a lithography mask, involving the steps of exposing a lithography substrate with actinic radiation through the lithography mask in a chamber; removing the lithography mask from the chamber, wherein the lithography mask contains carbon contaminants; and contacting the lithography mask with sulfur trioxide thereby reducing the carbon contaminants thereon.

20 Claims, No Drawings

CLEANING CARBON CONTAMINATION ON MASK USING GASEOUS PHASE

TECHNICAL FIELD

The present invention generally relates to improved lithography processing. In particular, the present invention relates to reducing carbon contamination on lithography masks using sulfur trioxide.

BACKGROUND ART

Microlithography processes for making miniaturized electronic components, such as in the fabrication of computer chips and integrated circuits, are of increasing importance as the trend towards miniaturization and integration continues. Lithography involves the use of resists to temporarily mask a semiconductor substrate surface to enable site specific additive, subtractive, or enhancing processing (e.g., deposition, etching, doping). Lithography specifically involves applying a coating or film of a resist using a mask to a substrate material, such as a silicon wafer used for making integrated circuits. The substrate may contain any number of layers or devices thereon.

The resist coated substrate is baked to evaporate any solvent in the resist composition and to fix the resist coating onto the substrate. The baked coated surface of the substrate is next subjected to selective radiation through a mask; that is, an image-wise exposure to radiation using a lithography mask to create the image. This radiation exposure causes a chemical transformation in the exposed areas of the resist coated surface. Types of radiation commonly used in microlithographic processes include visible light, ultraviolet (UV) light and electron beam radiant energy. Masks are conventionally made of a pellicle encapsulated patterned chromium layer over a quartz substrate or a fused silicon substrate, wherein the patterned chromium layer is formed using a resist.

After selective exposure, the resist coated substrate is treated with a developer solution to dissolve and remove either the radiation-exposed or the unexposed areas of the resist (depending upon whether a positive resist or a negative resist is utilized) resulting in a patterned or developed resist. Many developer solutions contain water and a base, such as water and a hydroxide compound.

Treating a selectively exposed resist with a developer conventionally involves depositing the liquid developer solution over the resist clad substrate and spinning the substrate whereby the liquid developer solution and dissolved areas of the resist are removed from the substrate by centrifugal forces. A rinsing solution, typically deionized water, is then deposited over the resist clad substrate and the substrate is spun again to remove the water and any debris solubilized by the water. Spinning the substrate is a convenient and inexpensive method of removing materials from substrate.

The patterned resist covered substrate is then subject to standard semiconductor processing such as material deposition, etching, or doping. Since the patterned resist only covers a portion of the substrate, the standard semiconductor processing techniques impact desired areas of the substrate. This is the basis for fabricating integrated circuit chips.

After standard semiconductor processing (material deposition, etching, or doping) is completed, the patterned resist is removed or stripped from the substrate. This process is repeated numerous times until a desired product is obtained. Often times masks are used over and over again, until the number/size of defects on the mask becomes fatally large. Due to repeated exposure by light, a form of energy, charges are formed on masks. Various contaminating particles are attracted to these charges, causing defects on the mask.

It is desirable to use a mask as many times as possible. This is because masks are becoming increasingly difficult to fabricate, given the small features required and the current limitations of lithography. Maintaining continuous production is important and requires a mask free of contamination. Other important parameters associated with making and using masks include pattern position accuracy, feature size control, and defect density. In sum, fabricating a mask is complex and costly. And using more than one mask to make the same feature in different wafers raises repeatability concerns. Therefore it is desirable to use every lithography mask as much as possible.

Defects on masks, such as the accumulation of carbon containing contaminants, are caused by a number of factors including the laser employed to irradiate and underlying photoresist. As the trend to miniaturization continues, smaller and smaller contaminant particles constitute defects on lithography masks. Attempts are therefore made to maintain and clean masks. However, there are concerns associated with mask cleaning. For example, cleaning schemes are intended to effectively clean mask, prevent re-deposition of contaminant particles, prevent damage to the mask, and minimize safety and environmental hazards. Successfully achieving all of the goals is difficult.

While attempts at cleaning masks are made, it is noted that cleaning a lithography mask is different from cleaning a wafer. In this connection, cleaning a lithography mask requires attending to chromium and chromium oxide surfaces whereas cleaning wafers generally does not, cleaning a lithography mask requires zero defects whereas cleaning wafers generally does not, and the square/rectangular shaped surfaces of masks are difficult to clean using spray processes (lithography masks generally contain a much higher density of square/rectangular shaped surfaces than wafers). Accordingly, cleaning processes useful for wafers are not necessarily applicable to cleaning lithography masks.

SUMMARY OF THE INVENTION

The present invention provides an improved cleaning process in connection with lithography. The present invention also provides methods for minimizing the presence of carbon contaminants on lithography masks. As a result of the present invention, lithography masks are improved by substantially increasing the number of times any given lithography mask can be used. Therefore, also as a result of the present invention, improved repeatability with regard to making large batches of integrated circuit chips is achieved.

In one embodiment, the present invention relates to a method of processing a lithography mask, involving the steps of exposing a lithography substrate with actinic radiation through the lithography mask in a chamber; removing the lithography mask from the chamber, wherein the lithography mask contains carbon contaminants; and contacting the lithography mask with sulfur trioxide thereby reducing the carbon contaminants thereon.

In another embodiment, the present invention relates to a method of reducing carbon contaminants on a lithography mask, involving the steps of exposing a lithography substrate having a resist thereon with actinic radiation through the lithography mask in a chamber; removing the lithography mask from the chamber, wherein the lithography mask contains carbon contaminants; and contacting the lithography mask with a gas comprising from about 1% to about 100% by weight of sulfur trioxide and from about 0% to about 99% by weight of at least one inert gas thereby reducing the amount of carbon contaminants thereon.

In yet another embodiment, the present invention relates to a method of reducing carbon contaminants on a lithography mask, involving the steps of exposing a lithography substrate having a resist thereon with actinic radiation through the lithography mask in an exposure chamber; removing the lithography mask from the exposure chamber, wherein the lithography mask contains carbon contaminants; and contacting the lithography mask with a plasma comprising from about 10 sccm to about 10 slm of sulfur trioxide and from about 0 sccm to about 10 slm of at least one inert gas thereby reducing the amount of carbon contaminants thereon.

DISCLOSURE OF INVENTION

The present invention involves improving the processing of a lithography mask by reducing undesirable carbon contaminants on the lithography mask. The present invention more specifically involves contacting the lithography mask with sulfur trioxide which, in turn, effectively reduces the amount of carbon contaminants on the lithography mask. This reduction is accomplished without damaging or deleteriously effecting the lithography mask (and specifically without damaging the chrome or the quartz/fused silicon substrate of the lithography mask).

During lithography, a resist is provided over a semiconductor substrate. The semiconductor substrate is typically a silicon substrate optionally with various elements and/or layers thereover; including metal layers, barrier layers, dielectric layers, device structures, active elements and passive elements including polysilicon gates, wordlines, source regions, drain regions, bit lines, bases, emitters, collectors, conductive lines, conductive plugs, etc. The resist is provided over at least a portion of the substrate, but typically over the entire substrate.

Any carbon containing resist may be applied to the substrate surface by any suitable means. Carbon containing resists include organic photoresists. For example, a 157 nm photoresist, a 193 nm photoresist, a 13 nm photoresist, an 11 nm photoresist, an I-line, H-line, G-line, E-line, deep V, extreme UV, X-ray resist, electron beam resist or chemically amplified photoresist material may be spin-coated on the substrate surface. Spin-coating involves depositing the resist in a solution over a spinning substrate. The centrifugal forces of the spinning substrate serve to evenly distribute the resist over the substrate.

Positive or negative resists may be used, but positive resists are preferred. Resists are commercially available from a number of sources, including Shipley Company, DuPont, Arch Chemical, Aquamer, Hunt, Hoechst. Celanese Corporation, Clariant, JSR Microelectronics, and Brewer. The resist is typically applied to a thickness from about 2,000 Å to about 30,000 Å, although the thickness of the resist is not critical to the invention.

Optionally after the resist is applied to the substrate surface, the resist covered substrate is subjected to a soft bake to drive off excess solvent and/or to increase adhesion with the substrate surface. The soft bake involves heating at an elevated temperature for a suitable period of time.

The resist covered substrate is selectively exposed to actinic radiation or electron beams (for convenience, actinic radiation shall encompass any exposure means) to cause a chemical transformation in desired regions of the resist. The wavelength of radiation is not critical to the invention, as it depends primarily upon the identity of the resist material. A mask is employed to selectively expose the resist. The mask is typically made of a pellicle encapsulated, patterned chromium layer over a quartz/fused silicon substrate, wherein the patterned chromium layer is formed using a photoresist.

The selectively exposed resist is developed using a suitable developer, such as an aqueous developer. During development, either the exposed portion of the resist (in embodiments where a positive resist is employed) or the unexposed portion of the resist (in embodiments where a negative resist is employed) is soluble or is solubilized in the developing solution. The portion of the resist that is not substantially soluble in the developing solution remains on the substrate. Development results in a patterned resist (the remaining portion of the resist) over the substrate surface. Various semiconductor processing is performed, taking advantage of the patterned resist. In particular, materials may be deposited over the patterned resist covered substrate surface, exposed areas of the substrate surface may be etched, or exposed areas of the substrate surface may be doped or otherwise treated.

After semiconductor processing is completed, the patterned resist is removed or stripped from the substrate using any suitable means. This lithography process may be repeated after cleaning the lithography mask. Carbon contaminants tend to accumulate during lithography processing, and such carbon contaminants may constitute fatal defects that would prevent the use of the mask. Cleaning the lithography mask enable the repeated use of the mask without having to fabricate a new lithography mask.

Sulfur trioxide is contacted with the lithography mask in any suitable manner. While not wishing to be bound by any theory, it is believed that the sulfur dioxide oxidizes carbon contaminants, which can then be removed through the air. For instance, sulfur dioxide can oxidize carbon containing resist debris into carbon dioxide, which can be removed by vacuum or an exhaust. The amount of sulfur trioxide is primarily dependent upon the amount of carbon contaminants on the lithography mask.

It is noted that contacting the lithography mask with the sulfur trioxide does not strip the patterned chromium layer from the lithography mask substrate. Contacting the lithography mask with the sulfur trioxide in accordance with the invention occurs in a separate chamber from processing the subject wafer. In this connection, the conditions and methods set forth herein are suited for carbon contaminant reduction from a lithography mask, and not necessarily for cleaning a wafer. In fact, the conditions and methods using sulfur trioxide set forth herein may not be well suited for cleaning a wafer in many instances. The actions of cleaning a wafer and carbon contaminant reduction are separate and distinct.

After a lithography cycle (deposition of a resist, selective irradiation through a lithography mask, removal of the mask, development, processing, and stripping of the patterned resist), the lithography mask may be rinsed prior to contact with sulfur trioxide. Rinsing typically involves contacting the lithography mask with deionized water. Alternatively or additionally, the lithography mask may be rinsed with deionized water after contact with sulfur trioxide.

In one embodiment, the sulfur trioxide contacted with the lithography mask is in the form of a plasma. In another embodiment, the sulfur trioxide contacted with the lithography mask is in the form of a gas. In yet another embodiment, the sulfur trioxide contacted with the lithography mask is in the form of a mixture of a plasma and a gas.

The sulfur trioxide plasma/gas may be derived from any suitable sulfur trioxide source. For example, liquid sulfur trioxide, which is primarily in gamma form, may be used as a source for sulfur trioxide gas and plasma. In a preferred embodiment, the sulfur trioxide source is in the gamma form. In general, stabilized gamma sulfur trioxide is used, where addition of a small quantity of inhibitor (stabilizer) prevents formation of the high melting-point beta and alpha forms. However, the beta and alpha forms sulfur trioxide may be employed. Gamma-sulfur trioxide is commercially available with such inhibitors. The stabilized sulfur trioxide can readily be remelted, if it is allowed to solidify. Gaseous sulfur trioxide may also be used as a source for sulfur trioxide gas and plasma. Gaseous sulfur trioxide can be obtained by oxidizing sulfur dioxide in the presence of a catalyst, such as platinum or vanadium pentoxide ($V_2O_5$).

The sulfur trioxide is preferably contacted with the lithography mask as soon as possible after the lithography mask is removed from the substrate involved in a lithography cycle. However, time may elapse after removal and before contact with sulfur trioxide. For example, the lithography mask is contacted by sulfur trioxide within about one hour after removal from the substrate involved in a lithography cycle. In another embodiment, the lithography mask is contacted by sulfur trioxide within about 10 minutes after removal from the substrate involved in a lithography cycle. The lithography mask is removed from the lithography substrate and the exposure chamber (separated from the lithography substrate having a resist thereon involved in the lithography processing) before contact with sulfur trioxide. As a result, potential damage to the lithography substrate by the sulfur trioxide is avoided. In other words, the lithography mask is treated in a separate chamber from the lithography substrate having a resist thereon.

Sulfur trioxide is contacted with the lithography mask removed from the substrate involved in a lithography cycle substrate for a time sufficient for the sulfur trioxide to reduce, minimize and/or eliminate carbon contamination on the lithography mask surface. The time of which the sulfur trioxide is contacted with the lithography mask is typically from about 1 second to about 1 hour. In another embodiment, the sulfur trioxide is contacted with the lithography mask for a period of time from about 5 seconds to about 10 minutes. In yet another embodiment, the sulfur trioxide is contacted with the lithography mask for a period of time from about 10 seconds to about 2 minutes.

In one embodiment, the plasma/gas containing sulfur trioxide further contains at least one inert gas, such as nitrogen, and the noble gases. Noble gases include argon, helium, neon, krypton, and xenon. In one embodiment where a plasma is employed, the plasma contains from about 10 sccm to about 10 slm of sulfur trioxide and from about 0 sccm to about 10 slm of at least one inert gas. In another embodiment, the plasma contains from about 25 sccm to about 5 slm of sulfur trioxide and from about 10 sccm to about 10 slm of at least one inert gas. In yet another embodiment, the plasma contains from about 50 sccm to about 1 slm of sulfur trioxide and from about 25 sccm to about 5 slm of at least one inert gas.

In one embodiment where a gas is employed, the gas contains from about 1% to about 100% by weight of sulfur trioxide and from about 0% to about 99% by weight of at least one inert gas. In another embodiment, the gas contains from about 3% to about 95% by weight of sulfur trioxide and from about 5% to about 97% by weight of at least one inert gas. In yet another embodiment, the gas contains from about 5% to about 90% by weight of sulfur trioxide and from about 10% to about 95% by weight of at least one inert gas.

In one embodiment, the sulfur trioxide plasma or gas does not contain water and/or sulfuric acid. In another embodiment, the sulfur trioxide plasma or gas does not contain oxygen. In yet another embodiment, the sulfur trioxide plasma or gas does not contain a peroxide. In this connection, in one embodiment, the sulfur trioxide plasma or gas consists essentially of sulfur trioxide and optionally at least one inert gas.

Any suitable pressure may be employed when using the sulfur trioxide containing plasma or gas. In one embodiment, the pressure in the processing chamber is from about 0.0001 Torr to about 1,000 Torr when using a plasma. In another embodiment, the pressure in the processing chamber is from about 0.001 Torr to about 500 Torr when using a plasma. In one embodiment, the pressure in the processing chamber is from about 10 Torr to about 1,500 Torr when using a gas. In another embodiment, the pressure in the processing chamber is from about 25 Torr to about 1,000 Torr when using a gas.

The temperature during contact between the sulfur trioxide and the lithography mask is typically from about 10° C. to about 500° C. In one embodiment, the temperature during contact between the sulfur trioxide and the lithography mask is from about 20° C. to about 400° C. In another embodiment, the temperature during contact between the sulfur trioxide and the lithography mask is from about 30° C. to about 300° C. The temperature is maintained to maximize the reduction of carbon contamination on the lithography mask, while not substantially damaging or degrading the components of the mask (such as the patterned chrome layer or the substrate).

Comparing the lithography mask surface before and after contact with sulfur trioxide, the mask surface after contact has at least about 75% less carbon containing debris (for example, by weight) than the mask surface before contact. In another embodiment, the mask surface after contact has at least about 90% less carbon containing debris than the mask surface before contact. In yet another embodiment, the mask surface after contact has at least about 98% less carbon containing debris than the mask surface before contact. In still yet another embodiment, the mask surface after contact has no detectable carbon containing debris or no carbon containing debris that constitute mask defects.

Once the carbon contaminants are oxidized, they can be removed from the processing chamber by vacuum, exhaust, or other suitable means. In instances where carbon contaminants are oxidized into carbon dioxide, a vacuum or exhaust is particularly effective in removing such materials.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of processing a lithography mask, comprising:
   exposing a lithography substrate with actinic radiation through the lithography mask in a chamber, wherein the lithography mask comprises a patterned chrome layer over a mask substrate;
   removing the lithography mask from the chamber, wherein the lithography mask contains carbon contaminants; and
   contacting the lithography mask with sulfur trioxide thereby reducing the carbon contaminants thereon.

2. The method of claim 1, wherein the lithography mask is encapsulated.

3. The method of claim 1, wherein the mask substrate is one of a quartz substrate and a fused silicon substrate.

4. The method of claim 1, wherein a sulfur trioxide plasma is contacted with the lithography mask.

5. The method of claim 4, wherein the sulfur trioxide plasma is contacted with the lithography mask under a pressure from about 0.0001 Torr to about 1,000 Torr.

6. The method of claim 1, wherein a sulfur trioxide gas is contacted with the lithography mask.

7. The method of claim 5, wherein the sulfur trioxide gas is contacted with the lithography mask under a pressure from about 10 Torr to about 1,500 Torr.

8. The method of claim 5, wherein the sulfur trioxide gas is made by oxidizing sulfur dioxide with a catalyst.

9. A method of reducing carbon contaminants on a lithography mask, comprising:
   exposing a lithography substrate having a resist thereon with actinic radiation through the lithography mask in a chamber, wherein the lithography mask comprises a patterned chrome layer over a mask substrate;
   removing the lithography mask from the chamber, wherein the lithography mask contains carbon contaminants; and
   contacting the lithography mask with a gas comprising from about 1% to about 100% by weight of sulfur trioxide and from about 0% to about 99% by weight of at least one inert gas thereby reducing the carbon contaminants thereon.

10. The method of claim 9, wherein the inert gas is at least one of nitrogen, argon, helium, neon, krypton, and xenon.

11. The method of claim 9, wherein the patterned resist stripped semiconductor structure is contacted with a gas comprising from about 3% to about 95% by weight of sulfur trioxide and from about 5% to about 97% by weight of at least one inert gas.

12. The method of claim 9, wherein the patterned resist stripped semiconductor structure is contacted with a gas comprising from about 5% to about 90% by weight of sulfur trioxide and from about 10% to about 95% by weight of at least one inert gas.

13. The method of claim 9, wherein the gas consists essentially of from about 3% to about 95% by weight of sulfur trioxide and from about 5% to about 97% by weight of at least one inert gas.

14. The method of claim 9, further comprising rinsing the lithography mask with deionized water.

15. The method of claim 9, wherein the lithography mask after contact with the gas has at least about 90% less carbon contaminants than the lithography mask before contact with the gas.

16. A method of reducing carbon contaminants on a lithography mask, comprising:
   exposing a lithography substrate having a resist thereon with actinic radiation through the lithography mask in an exposure chamber, wherein the lithography mask comprises a patterned chrome layer over a mask substrate;
   removing the lithography mask from the exposure chamber, wherein the lithography mask contains carbon contaminants; and
   contacting the lithography mask with a plasma comprising from about 10 sccm to about 10 slm of sulfur trioxide and from about 0 sccm to about 10 slm of at least one inert gas thereby reducing the carbon contaminants thereon.

17. The method of claim 16, wherein the inert gas is at least one of nitrogen, argon, helium, neon, krypton, and xenon.

18. The method of claim 16, wherein the lithography mask is contacted with a plasma comprising from about 10 sccm to about 10 slm of sulfur trioxide and from about 10 sccm to about 10 slm of at least one inert gas.

19. The method of claim 16, wherein the lithography mask is contacted with a plasma comprising from about 25 sccm to about 5 slm of sulfur trioxide and from about 25 sccm to about 10 slm of at least one inert gas.

20. The method of claim 16, wherein the lithography mask after contact with the plasma has at least about 90% less carbon containing debris than the lithography mask before contact.

* * * * *